(12) United States Patent
Weis

(10) Patent No.: US 8,455,948 B2
(45) Date of Patent: Jun. 4, 2013

(54) TRANSISTOR ARRANGEMENT WITH A FIRST TRANSISTOR AND WITH A PLURALITY OF SECOND TRANSISTORS

(75) Inventor: Rolf Weis, Villach (AT)

(73) Assignee: Infineon Technologies Austria AG, Villach (AT)

( * ) Notice: Subject to any disclaimer, the term of this patent is extended or adjusted under 35 U.S.C. 154(b) by 41 days.

(21) Appl. No.: 12/986,784

(22) Filed: Jan. 7, 2011

(65) Prior Publication Data

US 2012/0175634 A1 Jul. 12, 2012

(51) Int. Cl.
*H01L 29/161* (2006.01)
*H01L 27/088* (2006.01)
*H01L 27/098* (2006.01)
*H01L 29/20* (2006.01)

(52) U.S. Cl.
USPC ............. 257/339; 257/77; 257/194; 257/272; 257/296; 257/315; 257/328; 257/335; 257/367; 257/368; 257/401; 257/E27.016; 257/E27.069

(58) Field of Classification Search
USPC .................................................. 257/339, 367
See application file for complete search history.

(56) References Cited

U.S. PATENT DOCUMENTS

| | | | |
|---|---|---|---|
| 4,317,055 A | 2/1982 | Yoshida et al. | |
| 4,468,686 A | 8/1984 | Rosenthal | |
| 5,285,369 A | 2/1994 | Balakrishnan | |
| 6,304,094 B2 | 10/2001 | Gilliam | |
| 6,365,930 B1 | 4/2002 | Schillaci et al. | |
| 6,504,697 B1 | 1/2003 | Hille | |
| 6,888,396 B2 | 5/2005 | Hajimiri et al. | |
| 6,914,297 B2 | 7/2005 | Deboy et al. | |
| 2004/0089896 A1 | 5/2004 | Sakakibara | |
| 2006/0098365 A1 | 5/2006 | Harris et al. | |
| 2010/0032671 A1 | 2/2010 | Marshall | |
| 2010/0078707 A1 | 4/2010 | Haeberlen et al. | |
| 2010/0301403 A1 | 12/2010 | Min et al. | |

FOREIGN PATENT DOCUMENTS

| | | |
|---|---|---|
| DE | 197 45 040 A1 | 8/1998 |
| DE | 102 34 493 B3 | 2/2004 |
| DE | 10 2007 013 848 A1 | 9/2008 |
| DE | 102007013848 * | 9/2008 .................... 257/339 |
| JP | 2007-242719 A | 9/2007 |
| WO | WO 95/01667 A1 | 1/1995 |

OTHER PUBLICATIONS

Biela, J., et al., "5kV/200ns Pulsed Power Switch Based on a SiC-JFET Super Cascode," Proceedings of the IEEE International Power Modulators and High Voltage Conference, May 27-31, 2008, pp. 358-361, Las Vegas, Nevada.

* cited by examiner

*Primary Examiner* — Matthew W Such
*Assistant Examiner* — David Spalla
(74) *Attorney, Agent, or Firm* — Slater & Matsil, L.L.P.

(57) ABSTRACT

A transistor arrangement includes a first transistor having a drift region and a number of second transistors, each having a source region, a drain region and a gate electrode. The second transistors are coupled in series to form a series circuit that is coupled in parallel with the drift region of the first transistor.

20 Claims, 7 Drawing Sheets

US 8,455,948 B2

TRANSISTOR ARRANGEMENT WITH A FIRST TRANSISTOR AND WITH A PLURALITY OF SECOND TRANSISTORS

TECHNICAL FIELD

Embodiments of the present invention relate to a transistor arrangement with a first transistor, like a power transistor, and with a plurality of second transistors, like low-voltage transistors.

BACKGROUND

One important aim in the development of power transistors is to produce transistors with a high voltage blocking capability but, nevertheless, a low on-resistance ($R_{ON}$) and which have low switching losses.

Power transistors usually include a drift region arranged between a body region and a drain region and doped lower than the drain region. The on-resistance of a conventional power transistor is dependent on the length of the drift region in current flow direction and on the doping concentration of the drift region, wherein the on-resistance decreases when the length of the drift region is reduced or when the doping concentration in the drift region is increased. However, reducing the length of the region or increasing the doping concentration reduces the voltage blocking capability.

One possible way to reduce the on-resistance of a power transistor for a given voltage blocking capability is to provide compensation regions in the drift region, wherein the compensation regions are doped complementary to the drift region. Another possible way is to provide field plates in the drift region which are dielectrically insulated from the drift region and which are, for example, connected to a gate or source terminal of the transistor. In these types of power transistors, the compensation zones or the field plates partly "compensate" doping charges in the drift region when the component is in its off-state. This allows a higher doping of the drift region, which reduces the on-resistance, without reducing the voltage blocking capability.

These known transistors, however, have a high output capacitance. There is, therefore a need to provide a power transistor with a high voltage blocking capability, a low on-resistance and a low output capacitance.

SUMMARY OF THE INVENTION

A first embodiment relates to a transistor arrangement that includes a first transistor with a drift region. A plurality of second transistors each have a source region, a drain region and a gate electrode. The second transistors are connected in series to form a series circuit that is connected in parallel with the drift region of the first transistor. The source regions of the second transistors are coupled to the drift region and the gate electrodes of the second transistors are coupled to the drift region such that the source region and the gate region of each of the second transistors are coupled to the drift region at different positions.

A second embodiment relates to a transistor arrangement that includes a first transistor having a load path and a control terminal. A plurality of second transistors each have a load path between a first and a second load terminal and a control terminal. The second transistors have their load paths connected in series and connected in series to the load path of the first transistor. Each of the second transistors has its control terminal connected to the load terminal of one of the other second transistors. One of the second transistors has its control terminal connected to one of the load terminals of the first transistor.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 2, which includes

FIG. 6, which includes

FIG. 7, which includes

FIG. 14, which includes

DETAILED DESCRIPTION OF ILLUSTRATIVE EMBODIMENTS

Figure 1:
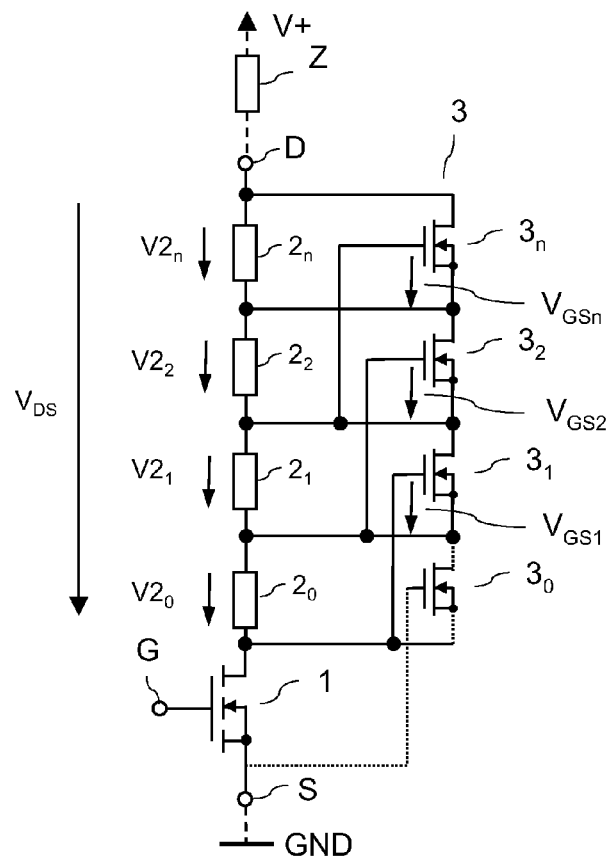
FIG. 1 illustrates a transistor arrangement with a first transistor having a drift region, and with a plurality of second transistors connected in series with each other and having source regions and gate electrodes coupled to the drift region of the first transistor.

FIG. 1 schematically illustrates a first embodiment of a transistor arrangement. The transistor arrangement includes a first transistor 1 implemented as an MOS transistor. The first transistor 1 includes a source terminal S which electrically contacts a source region, a gate terminal G which electrically contacts a gate electrode, and a drain terminal D which electrically contacts a drain region. In FIG. 1, the first transistor 1 is represented by its circuit symbol, so that the source S, gate G, and drain D terminals but not the source region, the gate electrode and the drain region are shown.

The first transistor 1 of FIG. 1 is a power transistor which further includes a drift region. The drift region is arranged between the drain terminal D and the source terminal S, and is a doped semiconductor region which mainly defines the voltage blocking capability of the first transistor 1. A conventional circuit symbol of an MOS transistor does not explicitly show or illustrate the drift region of the MOS transistor. However, since the drift region has a relevant function in the transistor arrangement illustrated in FIG. 1, the drift region of the first transistor 1, additionally to the circuit symbol, is also illustrated in FIG. 1. The drift region is represented by a series circuit with resistors $2_0$, $2_1$, $2_2$, $2_n$ connected between the drain terminal D and a body region (not shown in FIG. 1) of the first transistor 1. Since the drift region is a doped semiconductor region, each of the resistors $2_0$-$2_n$ illustrated in FIG. 1 represents the resistance of one section of the drift region.

Before explaining the other features of the transistor arrangement of FIG. 1, the basic operating principle of the first transistor 1 with the drift zone will be explained. For explanation purposes it will be assumed that the first transistor 1 is an n-type enhancement MOSFET (as represented by the circuit symbol in FIG. 1). However, any other type of MOS transistor, like an n-type depletion transistor, a p-type enhancement transistor, a p-type depletion transistor, or an IGBT, can be used as well. The different types of transistors have the same operating principle, which is that they can be switched on and off by applying a suitable drive potential to the gate terminal G or a suitable drive voltage between the gate terminal G and the source terminal S, respectively. The difference is that the control voltages (gate-source voltages) at which the individual transistors are switched on and off are different for the different types of transistors.

The n-type enhancement MOSFET 1 of FIG. 1 can be switched on by applying a positive voltage between the gate and the source terminals G, S. In the on-state of the first transistor 1 a resistance between the drain terminal D and the source terminal S, which is also referred to as on-resistance, is mainly defined by the drift region, in particular, by the doping concentration of the drift region and its length in the current flow direction. A drain-source voltage $V_{DS}$ of the first transistor 1 mainly drops across the drift region when the transistor is in its on-state. This voltage drop is dependent on the on-resistance of the first transistor 1 and on a load current flowing through the transistor. The first transistor 1 can, for example, be used for switching a load current through a load Z. For this, the first transistor 1 can be connected in series with a load Z between terminals for a positive supply potential V+ and a negative supply potential or reference potential GND. When the first transistor 1 is switched on, the supply voltage which is present between the supply terminals mainly drops across the load Z, wherein the voltage drop across the first transistor 1 is defined by the load current and the on-resistance of the first transistor 1. In conventional power transistors this voltage drop is, for example, typically in the range of between 0.1V and 3V.

When the first transistor 1 is switched off, the voltage drop across the first transistor 1 increases. In the off-state of the first transistor 1, the voltage $V_{DS}$ which is applied between the drain and source terminals D, S also mainly drops across the drift region which, besides the on-resistance, also defines the voltage blocking capability of the first transistor 1. This is because in the off-state, the drift zone is depleted of drift zone charge carrier. The voltage drop $V_{DS}$ across the drift region can be in the range of between several 10 volts (V) to several 100 volts (V) up to 1 kV and more.

In order to reduce the electrical resistance between the drain and the source terminals D, S when the first transistor 1 is switched on, the transistor arrangement of FIG. 1 further includes an arrangement 3 of a plurality of second transistors $3_1$, $3_2$, $3_n$. These second transistors are also implemented as MOS transistors which each include a gate terminal contacting a gate electrode, a drain terminal connecting a drain region and a source terminal connecting a source region. These second transistors $3_1$, $3_2$, $3_n$ are connected in series, with the series circuit with the second transistors $3_1$, $3_2$, $3_n$ being connected in parallel with the drift region. Further, the source terminal or source region of each of the second transistors is coupled to the drift region, and the gate terminal or gate electrode of each of the second transistors is therefore optionally coupled to the drift region too.

In the embodiment illustrated in FIG. 1, each of the second transistors $3_1$, $3_2$, $3_n$ is connected in parallel with one section of the drift region, wherein the individual sections of the drift region are represented by the resistors $2_1$, $2_2$, $2_n$ in FIG. 1. The second transistors $3_1$, $3_2$, $3_n$ are switched on and off dependent on the voltage drop across the drift region, so that no additional external terminals are required for controlling the second transistors, wherein the second transistors may influence or define the voltage across the drift region. The overall transistor arrangement illustrated in FIG. 1 can be switched on and off like a conventional transistor by applying a suitable control voltage between the gate and source terminals G, S.

In FIG. 1, the gate electrodes and the source regions of the second transistors $3_1$, $3_2$, $3_n$ are coupled to the drift region such that each of the second transistors $3_1$, $3_2$, $3_n$ is controlled by the voltage drop across an associated section of the drift region. In FIG. 1, a first one $3_1$ of the second transistors is, for example, controlled by a voltage drop $V2_0$ across a first section $2_0$ of the drift region, a second one $3_2$ of the transistors is controlled by a voltage drop $V2_1$ across a second section $2_1$ of the drift region, etc. For this, the first drift region section $2_0$ is connected between gate and source of the second transistor $3_1$, the second drift region section $2_1$ is connected between gate and source of the transistor $3_2$, etc. The control voltage of any of the second transistors is dependent on the voltage drop $V_{DS}$ across the drift region and is dependent on the distance between the positions at which the gate electrode and the source region of the second transistor is coupled to the drift region.

In order to reduce the on-resistance of the first transistor 1 with the drift zone, the second transistors $3_1$, $3_2$, $3_n$ are switched on when the first transistor 1 is in its on-state, as the voltage drop is becoming small across the drift zone. When the first transistor 1 is in its off-state, the second transistors $3_1$, $3_2$, $3_n$ are switched off, because of the high voltage drop $V_{DS}$ over the drift zone with the depleted drift zone charge carrier. When the first transistor 1 is in its on-state, the resistance of its drift region is low, so that a voltage drop $V_{DS}$ across the drift region is low and, consequently, the voltage drops $V2_0$, . . . , $V2_n$ across the individual drift region sections $2_0$, . . . , $2_n$ are low. When the first transistor 1 is in its off-state, the voltage drop $V_{DS}$ across the drift region is significantly higher than in the on-state and, consequently, the voltage drops $V2_0$, . . . , $V2_n$ across the individual drift region sections are also significantly higher than in the on-state.

According to one embodiment, the positions at which the source regions and the gate electrodes of the individual transistors are connected to the drift region are selected such that the absolute value of the drive voltage between the gate electrode and the source region is very small, e.g., between 0.005V and 0.5V when the first transistor 1 is in its on-state, and is e.g. between 1V and 30V when the first transistor 1 is in its off-state.

The drive voltage of the second transistors $3_1$-$3_n$ is low, like in the absolute range of between 0.005V and 0.5V, when the first transistor 1 is on, and the voltage drop over the second transistors $3_1$-$3_n$ is high, like in the absolute range of between 1V and 30V, when the first transistor 1 is off. The individual second transistors $3_1$-$3_n$ are selected such that they can be switched on by the low voltage drop across their associated drift region section when the first transistor is in its on-state, and that they can be switched off by the high voltage drop across their associated drift region section if the first transistor 1 is in its off-state. In FIG. 1, the second transistor are connected such that positive voltage drops across the individual drift region sections result in negative drive voltages of the individual second transistors. For example, $V_{GS1} = -V2_0$, where $V_{GS1}$ is the control voltage (gate-source voltage) of first transistor $3_1$. Equivalently, $V_{GS2} = -V2_1$, where $V_{GS2}$ is the control voltage of the second transistor $3_2$. When the first transistor 1 is an n-type transistor, the second transistors are selected such that they can be switched on by a low negative control voltage and that they can be switched off by a higher negative control voltage. Suitable transistors are, for example, n-type depletion transistors. However, p-type depletion transistors can be used as well. In this case, the second transistors are coupled to the drift region such that a low positive control voltage is applied to the second transistors when the first transistor 1 is in its on-state and that a higher positive control voltage is applied to the second transistors when the first transistor 1 is in its off-state. Even enhancement transistors could be used for the second transistors when the work function of the gate electrode is chosen such that an n-type transistor is already switched on at a low negative drive voltage and that a p-type transistor is switched on at a low positive drive voltage.

In the embodiment illustrated in FIG. 1, a first section $2_0$ of the drift region, which is the section arranged most distant to the drain terminal D and closest to the source terminal S, serves to generate the control voltage for the first one $3_1$ of the second transistors, but has no second transistor connected in parallel. Optionally, a second transistor $3_0$ is also connected in parallel with this first drift region section $2_0$, wherein the gate terminal of this transistor $3_0$ is connected to the source terminal of the first transistor 1.

Figures 2A, 2B:
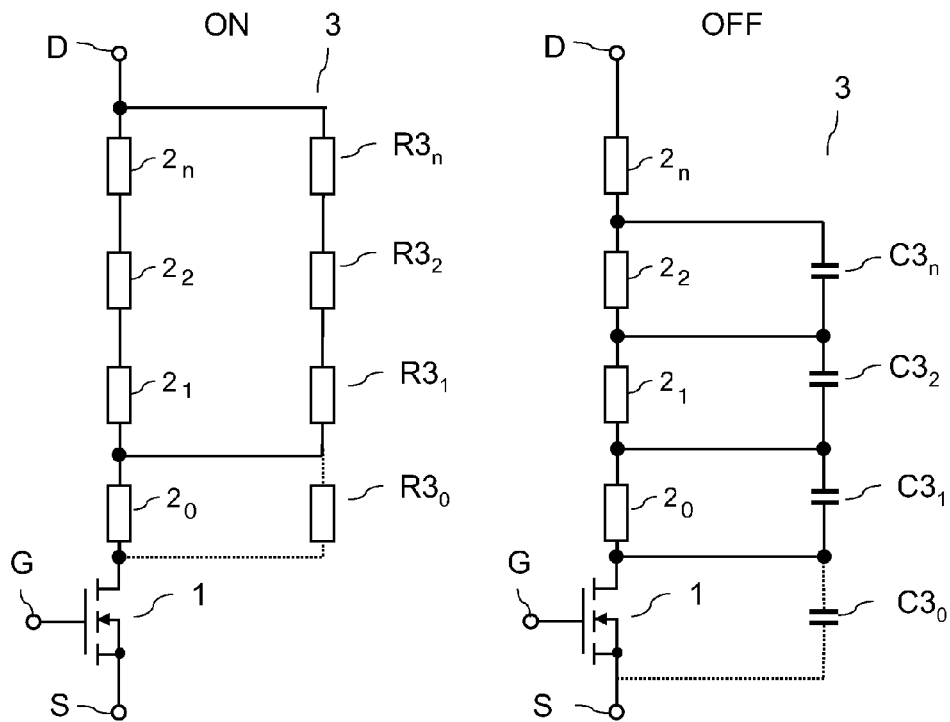
FIGS. 2A and 2B, show the equivalent circuit diagrams of the transistor arrangement of FIG. 1 when the first transistor is switched on (FIG. 2A) and when the first transistor is switched off (FIG. 2B)

FIGS. 2A and 2B show the equivalent circuit diagram of the transistor arrangement of FIG. 1 when the first transistor 1 is in its on-state (see FIG. 2A) and when the first transistor 1 is in its off-state (see FIG. 2B). Referring to FIG. 2A, when the first transistor 1 is in its on-state the second transistors $3_1$-$3_n$ and the optional second transistor $3_0$ are switched on and, therefore, provide a current path parallel to the drift region which helps to reduce the overall on-resistance of the transistor arrangement. This current path parallel to the drift region is represented in FIG. 2A by a series circuit with resistors $R3_1$, $R3_2$, $R3_n$ (and optional $R3_0$) wherein each of these resistors represents the on-resistance of one of the second transistors $3_1$-$3_n$. The second transistors $3_0$, $3_1$-$3_n$ are low voltage transistors which according to one embodiment have an on-resistance which is lower than the resistance of the drift region sections $2_0$, $2_1$-$2_n$.

When the first transistor 1 is switched off and, therefore, the second transistors are also switched off—as the voltage $V_{DS}$ drops over the drift zone —, the series circuit with the gate-source capacitances of the second transistors $3_0$, $3_1$-$3_n$ dominate the function of the second transistors $3_0$, $3_1$-$3_n$. The drift zone is depleted of charge carriers and therefore can be left away. In the off-state of the first transistor 1, the gate source capacitance of any one of the second transistors, like, e.g., transistor $3_2$, stores those electrical charges which, in the on-state of the first transistor 1, were required in the neighboring transistor, like, e.g., transistor $3_1$, for generating a conducting channel in the body region of this neighboring transistor. Thus, electrical charges which are required for switching on and off the individual second transistors are only shifted between the body region of one second transistor and the gate-source capacitance of a neighboring second transistor when the first transistor 1 transitions from the on-state to the off-state, and vice versa. Thus, these charges do not have to be provided from externally via the drain and source terminals of the first transistor 1, resulting in a low output capacitance of the transistor arrangement.

In FIG. 2B, the gate-source capacitances $C3_1$-$C3_n$ (and $C3_0$ of the optional transistor $3_0$) are shown. These gate-source capacitances dominate the behavior of the arrangement when the second transistors are in their off-state.

It should be noted that although in FIG. 1 only n=3 or n+1=4, respectively, second transistors are illustrated, the basic principle is not restricted to this number of second transistors. An arbitrary number of second transistors $3_0$-$3_n$ can be arranged in series with each other and parallel with the drift region, wherein the number of second transistors $3_0$-$3_n$ is dependent on the desired voltage blocking capability of the transistor arrangement with the first transistor 1 and the second transistors $3_0$-$3_n$. Since the second transistors $3_0$-$3_n$ are low-voltage transistors their voltage blocking capability is significantly lower than the voltage blocking capability of the first transistor 1 with the drift zone. If, for example, the voltage blocking capability of the first transistor with the drift zone is $V_{DSmax}$ and the voltage blocking capability of each of the second transistors is $V3_{DSmax}$, then the number of second transistors at least to be connected in series with each other and parallel to the drift region is given by the quotient $V_{DSmax}/V3_{DSmax}$.

Figure 3:
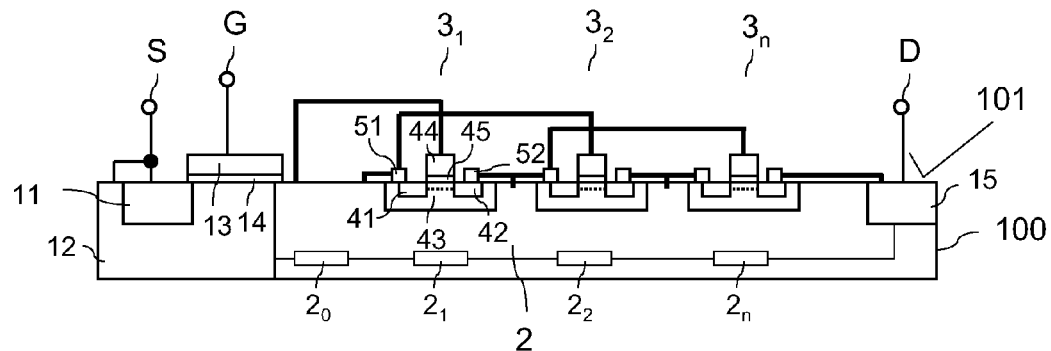
FIG. 3 schematically illustrates a first embodiment for implementing the first and second transistors in a semiconductor body.

FIG. 3 illustrates a first embodiment for implementing the transistor arrangement. In this embodiment, the transistor arrangement includes a semiconductor body 100 in which active semiconductor regions of the first transistor 1 and the second transistors $3_0$-$3_n$ are implemented. Active semiconductor regions of these transistors are source regions, drain regions, body regions and, in case of the first transistor, the drift region.

Referring to FIG. 3, the first transistor 1 includes a source region 11 electrically connected to the source terminal S and a drain region 15 electrically connected to the drain terminal D. This transistor is implemented as a lateral transistor, which means that the source region 11 and the drain region 15 are arranged distant to one another in a lateral or horizontal direction of the semiconductor body 100. The first transistor 1 further includes a drift region 2 adjoining the drain region 15, and a body region 12 which is arranged between the source region 11 and the drift region 2. A gate electrode 13 serves to control a conducting channel between the source region 11 and the drift region 2 and is arranged adjacent to the body region 12 and dielectrically insulated from the body region 12 by a gate dielectric 14. The first transistor 1 is in its on-state when an electrical potential is applied to the gate electrode G which is suitable for inducing a conductive channel between the source region 11 and the drift region 2 in the body region 12.

The first transistor 1 is, for example, implemented as an n-type MOSFET. In this case, the source region 11, the drain region 15 and the drift region 2 are n-doped. Further, the first transistor 1 can be implemented as an enhancement transistor or as a depletion transistor. In an n-type enhancement transistor the body region 12 is p-doped, i.e., is doped complementarily to the source region 11 and the drift region 2. In a depletion transistor the body region 12 at least adjacent to the gate dielectric 14 includes an n-type channel region which extends from the source region 11 to the drift region 2 and which can be depleted of charge carriers by applying a suitable control potential at the gate terminal G. The first transistor 1 could also be implemented as a p-type enhancement or depletion transistor. In p-type transistors, the individual semiconductor regions are doped complementarily to the corresponding semiconductor regions in an n-type transistor.

Referring to FIG. 3, the active semiconductor regions of the second transistors are implemented in the drift region 2 or are implemented between the drift region 2 and a surface 101 of the semiconductor body 100. At this surface 101 the source 11 and drain 15 regions are connected to the source S and drain D terminals. In FIG. 3, only three second transistors $3_1$, $3_2$, $3_n$ are shown. However, this is only an example, the number n of second transistors is, of course, not limited to n=3.

The individual second transistors are implemented in identical manner, so that in FIG. 3 reference characters are only indicated for a first one $3_1$ of these second transistors. These second transistors $3_1$-$3_n$ each include a source region 41 and a drain region 42 arranged distant to the source region 41 in a lateral direction of the semiconductor body 100. A body region 43 is arranged between the source region 41 and the drain region 42. A gate electrode 44 is arranged adjacent to the body region 43 and dielectrically insulated from the body region 43 by a gate dielectric 45 serves to control a conducting channel between the source region 41 and the drain region 42. The source region 41 is electrically connected to a source electrode 51 which, in the embodiment of FIG. 3, also electrically contacts the body region 43. The drain region 42 is electrically connected to a drain electrode 52.

In the transistor arrangement of FIG. 3, the second transistors $3_1$-$3_n$ are arranged next to each other in the current flow direction of the first transistor 1. The "current flow direction" is the direction in which the source region 11 and the drain region 15 of the first transistor 1 are arranged distant to each other.

The source electrode of one second transistor is connected with the drain electrode of one neighboring second transistor, so that the second transistors $3_1$, $3_2$, $3_n$ are connected in series with each. Further, the source terminals of the individual second transistors $3_1$, $3_2$, $3_n$ are coupled to the drift region 2. For explanation purposes it is assumed that the first transistor 1 is an n-type transistor and that the second transistors $3_1$, $3_2$, $3_n$ are also n-type transistors. In this case, the drain region 42 or the drain electrode 52 of each of the second transistors $3_1$-$3_n$ is arranged closer to the drain region 15 than the corresponding source region 41 of the transistor. Further, the drain region 42 or the drain electrode 52 is connected to the source region 41 or the drain electrode 52 of a neighboring transistor which, in the embodiment of FIG. 3, is the neighboring transistor in the direction of the drain electrode 15. For example, the drain region 42 of the second transistor $3_1$ is electrically connected to the source region of the neighboring transistor $3_2$, wherein the transistor $3_2$ is the neighboring transistor to transistor $3_1$ in the direction of the drain region 15.

In FIG. 3, the second transistors $3_1$-$3_n$ are planar transistors which have their gate electrode 44 arranged above the surface 101 of the semiconductor body 100. In these transistors the body region 43 is doped complementarily to the source region 41 and the drain region 42 and may include a doped channel region (illustrated in dotted lines) of the same doping type as the source region 41 and the drain region 42 and arranged between the source region 41 and the drain region 42 and adjacent to the gate dielectric 45. Through these source electrodes the individual second transistors, which are connected in series, are also connected in parallel with the drift region 2. For example, the second transistor $3_1$ is connected in parallel with a first section (represented by resistor $2_1$ in FIG. 3) of the drift region 2 via its source electrode 51 and the source electrode of the neighboring second transistor $3_2$. The second transistor $3_n$ which of the plurality of second transistors $3_1$, $3_n$ is arranged closest to the drain region 15 has its drain electrode connected to the drain region 15 at the end of the drift zone of the first transistor with the drift zone 2.

Further, the second transistors $3_1$, $3_2$, $3_n$ have their gate electrodes coupled to the drift region 2. Referring to FIG. 3, except for the second transistor $3_1$ which is arranged closest to the body region 12 of the first transistor, the second transistors $3_2$, $3_n$ have their gate electrodes coupled to the source electrode of the neighboring second transistor. In this case, the neighboring transistor of one of the second transistors is the transistor which is arranged next to the one transistor in the direction of the body region. If, for example, $3_i$ denotes one of the second transistors and $3_{i-1}$ denotes a transistor which is arranged next to transistor $3_i$ in the direction of the body region 12, then transistor $3_i$ has its gate terminal connected to the source terminal of transistor $3_{i-1}$. However, this is only an example. One second transistor $3_i$ could also have its gate terminal connected to the source terminal of transistor $3_{i-2}$ or $3_{i-3}$ which is the second or third transistor as seen from the position of the transistor $3_i$ in the direction of the body region 12.

The second transistors $3_1$-$3_n$ are controlled by the voltage drop across the drift region 2 between those positions at which the source region and the gate electrode of the second transistors $3_1$-$3_n$ are coupled to the drift region 2. This voltage drop is usually low when the first transistor 1 is in its on-state and is usually high when the first transistor is in its off-state. The positions at which the gate electrodes 44 and the source regions 41 of the individual second transistors $3_1$-$3_n$ are coupled to the drift region 2 are selected such that when the first transistor 1 is in the on-state the voltage drop between the source region 41 and the gate electrode 44 of each of the second transistors $3_1$-$3_n$ is suitable to switch the second transistors $3_1$-$3_n$ on, while when the first transistor 1 is in its off-state the (higher) voltage drop is suitable to switch the second transistors $3_1$-$3_n$ off. In the embodiment illustrated in FIG. 3, the first transistor 1 can be an n-type transistor and the second transistors $3_1$-$3_n$ can also be n-type transistors. In this case, the voltage drops between the gate electrode 44 and the source regions 41 of the second transistors $3_1$-$3_n$ are negative voltages which are low when the first transistor is on and which are high, when the first transistor is off. The second transistors are selected such that their threshold voltage is low enough that these transistors $3_1$-$3_n$ are switched on at low negative drive voltages.

In an n-type first transistor, the second transistors $3_1$-$3_n$ could also be implemented as p-type transistors. In this case, the gate electrodes of the individual second transistors will have to be connected to source terminals of the second transistors which are arranged in the direction of the drain region 15. These p-type transistors are implemented such that they are switched on at a low positive voltage and that are switched off at a higher positive voltage.

Figure 4:
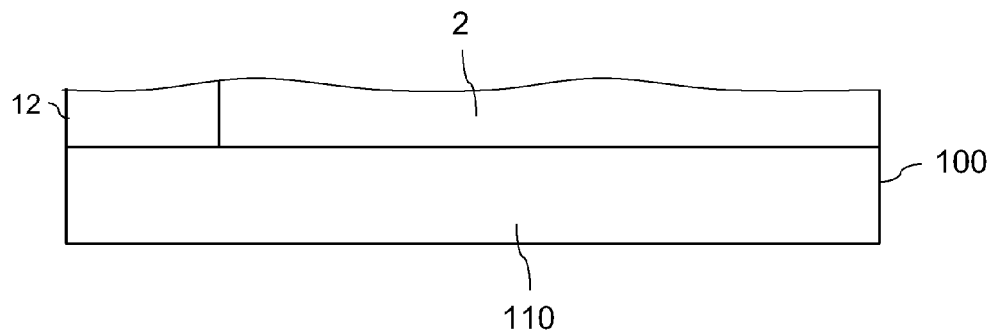
FIG. 4 schematically illustrates a first embodiment of a substrate section of the arrangement of FIG. 3.

In FIG. 3, only a semiconductor layer is illustrated in which the active semiconductor regions of the first and second transistors $1$, $3_1$-$3_n$ are illustrated. This semiconductor layer can be arranged on any suitable substrate. Referring to FIG. 4, which only shows a lower section of the semiconductor layer with the active regions, the layer with the active regions of FIG. 3 can be arranged on a semiconductor substrate 110 which is doped complementarily to the drift region 2. The substrate could also extend to drift region 2, i.e., there is no drift zone doping.

Figure 5:
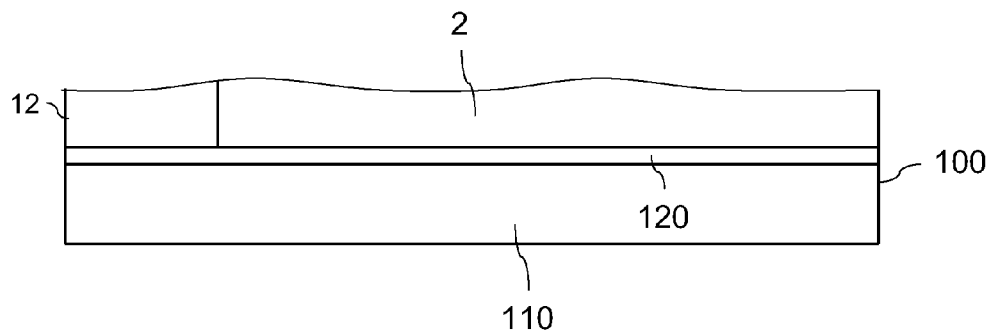
FIG. 5 schematically illustrates a second embodiment of a substrate section of the arrangement of FIG. 3.

Referring to FIG. 5, the semiconductor layer with the active regions can also be arranged on an SOI substrate. This SOI substrate includes a semiconductor substrate 110 and an insulation layer 120 arranged between the substrate 110 and the semiconductor layer with the active regions.

Figures 6A, 6B:
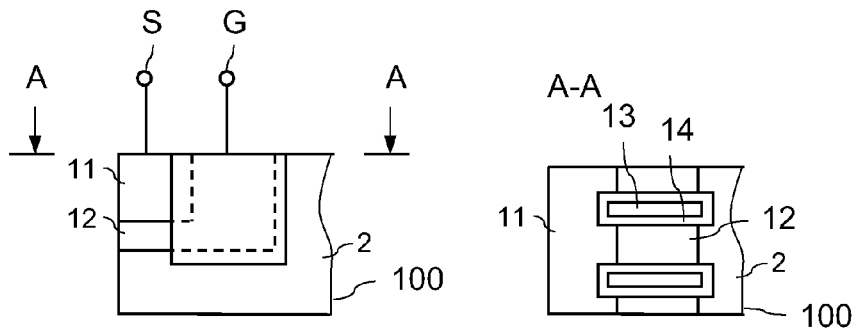
FIGS. 6A and 6B illustrates a further embodiment for implementing source and body regions and a gate electrode of the first transistor.

In FIG. 3, the first transistor has a planar gate electrode 13, which is a gate electrode which is arranged above the surface 101 of the semiconductor body 100. However, this is only an example. The first transistor 1 could be implemented with any other known gate topology as well. FIGS. 6A and 6B illustrate further embodiments of a gate topology of the first transistor. FIG. 6A shows a vertical cross section of the semiconductor body 100 in that region, in which the source region 11, the body region 12 and the gate electrode are arranged, and FIG. 6B illustrates a horizontal cross section in a section plane A-A shown in FIG. 6A. The drain region or a drain terminal is not shown in FIGS. 6A and 6B.

Referring to FIGS. 6A and 6B the gate electrode 13 is arranged in trenches which from the first surface 101 extend in a vertical direction of the semiconductor body 100. These trenches in a horizontal direction extend from the source region 11 to the drift region 2, wherein the body region 12 is arranged between these trenches and separates the source region 11 from the drift region 2. In a conventional manner, the gate electrode 13 is dielectrically insulated from the body region 12 (and the source and drift regions 11, 2) by the gate dielectric 14.

It should be noted that the second transistors $3_1$-$3_n$ can also be implemented with other geometries or topologies than illustrated in FIG. 3. Further illustrative embodiments for implementing these second transistors are illustrated in FIGS. 7A to 7C and 8A to 8B.

Figures 7A, 7B, 7C:
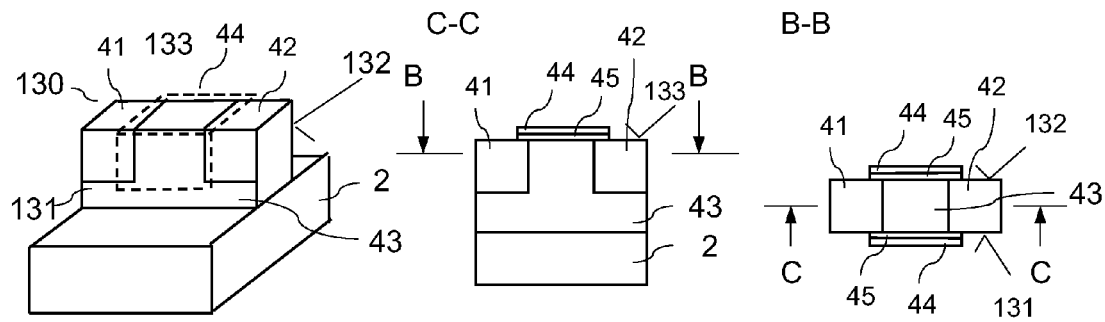
FIGS. 7A to 7C, illustrates a second embodiment for implementing the second transistors.

FIG. 7A shows a perspective view of a second transistor $3_i$ ($3_i$ represents any of the second transistors) implemented as a FINFET. FIG. 7B shows a vertical cross section and FIG. 7C shows a horizontal cross section through this second transistor. FIGS. 7A, 7B, 7C only show a section of the semiconductor body in which one second transistor is implemented. Active regions of the first transistor (besides a section of the drift region) and active regions of neighboring transistors are not shown.

Referring to FIGS. 7A-7C, the source, drain and body regions 41, 42, 43 of this transistor are arranged in a fin-like semiconductor section 130 above the drift region 2. In one horizontal direction, the source and drain regions 41, 42 extend from sidewall 131 to sidewall 132 of this fin-like semiconductor region 130. In a second direction which is perpendicular to the first direction the source and drain regions 41, 42 are arranged distant from each other and are separated by the body region 43. The gate electrode 44 is dielectrically insulated from the fin-like semiconductor region 130 by the gate dielectric 45 and is arranged adjacent to the body region 43 at the sidewalls 131, 132 and at a top surface 133 of this fin-like semiconductor region.

Figures 8A, 8B, 8C:
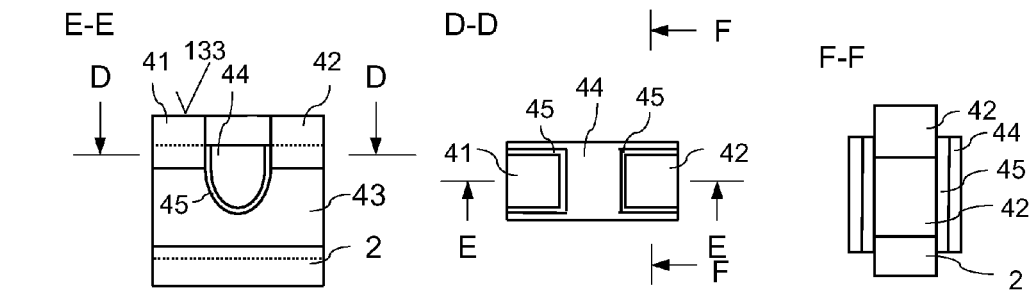
FIG. 8, which includes FIGS. 8A to 8C, schematically illustrates a further embodiment for implementing the second transistors.

FIGS. 8A to 8C illustrate a further embodiment of a second transistor implemented as a U-shape-surround-gate-FINFET. FIG. 8A shows a vertical cross section through the transistor, FIG. 8B shows a horizontal cross section through the transistor, and FIG. 8C shows a vertical cross section in a section plane F-F shown in FIG. 8B. In this transistor, the source region 41 and the drain region 42 also extend from sidewall 131 to sidewall 132 of the fin-like semiconductor region 130 in the first direction, and are arranged distant to each other in the second direction perpendicular to the first direction.

In the second direction the source region 41 and the drain region 42 are separated by a trench which extends into the body region 43 arranged below the source region 41 and the drain region 42. The gate electrode 44 is arranged adjacent to the body region 43 in the trench and along the sidewalls of the fin-like semiconductor region 130 and is dielectrically insulated from the body region 43 by the gate dielectric 44. In an upper region this trench can be filled with a dielectric material.

The second transistor of FIGS. 8A and 8B is, for example, implemented as a depletion transistor, like an n-type depletion transistor. In this case, the source and drain regions 41, 42 and the body region 43 have the same doping type, wherein the body region 43 usually has a lower doping concentration than the source and drain regions 41, 42. In order to be able to completely interrupt a conducting channel in the body region 43 between the source region 41 and the drain region 42, the gate electrode 44 along the sidewalls 131, 132 of the fin-like semiconductor region 130 completely extends along this semiconductor section 130 in the second direction. In the vertical direction the gate electrode 44 along the sidewalls 131, 132 extends from the source and drain regions 41, 42 to at least below the trench. According to one embodiment (not shown) the gate electrode 44 extends to the drift region 2. Also shown in FIGS. 8A and 9 is an optional insulation layer 46.

Figure 9:
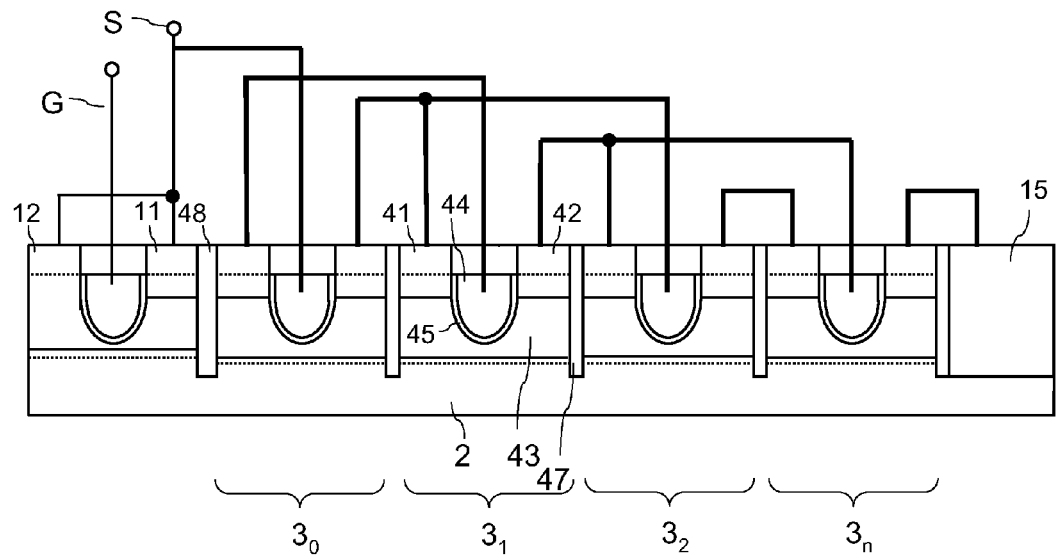
FIG. 9 schematically illustrates a transistor arrangement which includes second transistors according to FIG. 8.

FIG. 9 illustrates a vertical cross section through a transistor arrangement in which the second transistors are implemented as FINFETs with a topology as illustrated in FIGS. 8A and 8B. FIG. 9 illustrates a cross section through the fin-like semiconductor region in which the source and drain regions of the individual second transistors $3_0$-$3_n$ are arranged. The source and drain regions as well as the body regions of neighboring second transistors are insulated from each other by dielectric layers 47 which extend in a vertical direction of the fin in which the source and drain regions of the second transistors are implemented.

In the embodiment of FIG. 9 the first transistor is also implemented as a FINFET. In this transistor the source region 11 and the drift region 2 are dielectrically insulated from each other by the body region 12. The gate electrode 44, which is not shown in the cross section of FIG. 9, but the position of which at the sidewalls of the semiconductor fin is illustrated by dotted lines, extends from the source region 11 across the body region 12 to the drift region 2. The source terminal S electrically contacts the source region 11 and the body region 12 at the top surface of the semiconductor fin. The source region 11 and the body region 12 of the first transistor are insulated from the active semiconductor regions of a first one $3_0$ of the second transistors by a dielectric layer 48.

Figure 10:
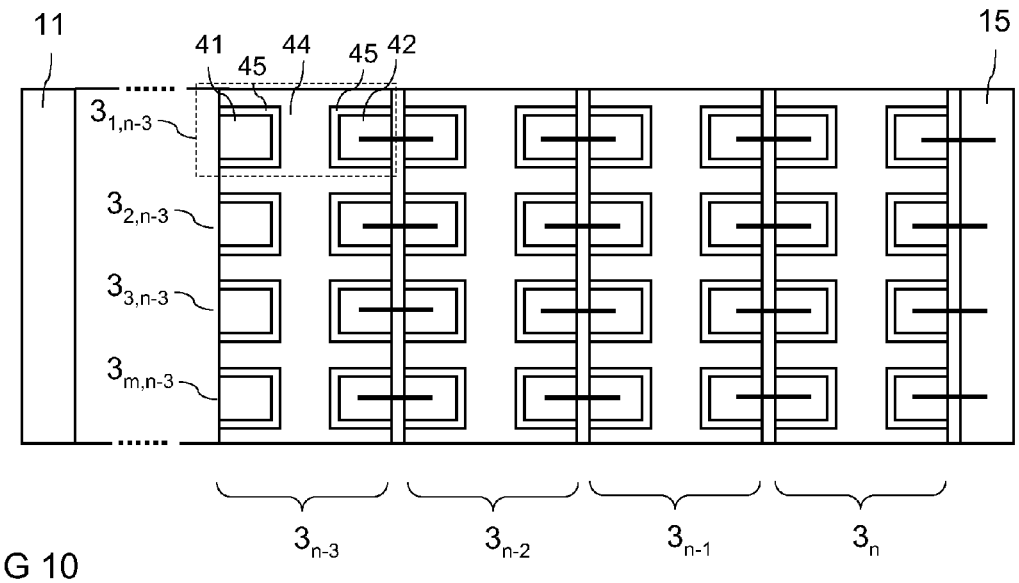
FIG. 10 illustrates a top view on a transistor arrangement in which the second transistors include several transistor cells connected in parallel.

The second transistors connected in series may include a number of transistor cells connected in parallel. This will be explained with reference to FIG. 10. FIG. 10 shows a top view on an arrangement with second transistors $3_{n-3}$, $3_{n-2}$, $3_{n-1}$, $3_n$, wherein each of these transistors has a plurality of transistor cells which, for a transistor $3_{n-3}$, are denoted as $3_{1,n-3}$, ..., $3_{m,n-3}$ in FIG. 10. Each of these transistor cells, like transistor cell $3_{1,n-3}$ is implemented as a FINFET with a topology as illustrated in FIGS. 8A and 8B. The individual transistor cells of one transistor, like transistor $3_{n-3}$ have a common gate electrode 44 which, in a manner not illustrated, is electrically connected to the source terminal of a neighboring second transistor. In FIG. 10, besides the arrangement with the plurality of second transistors only the drain region 15 and the source region 11 are schematically illustrated. The second transistors $3_{n-3}$-$3_n$ illustrated in FIG. 10 are transistors arranged close to the drain region 15, wherein the second transistor $3_n$ is the second transistor which has its drain regions electrically connected to the drain region 15 of the first transistor. Electrical connections between the source and drain regions of the individual second transistors are illustrated by bold lines in FIG. 10.

In the embodiment illustrated in FIG. 10, the source and drain regions of the individual transistor cells are arranged distant to each other in the current flow direction of the first transistor.

Figure 11:
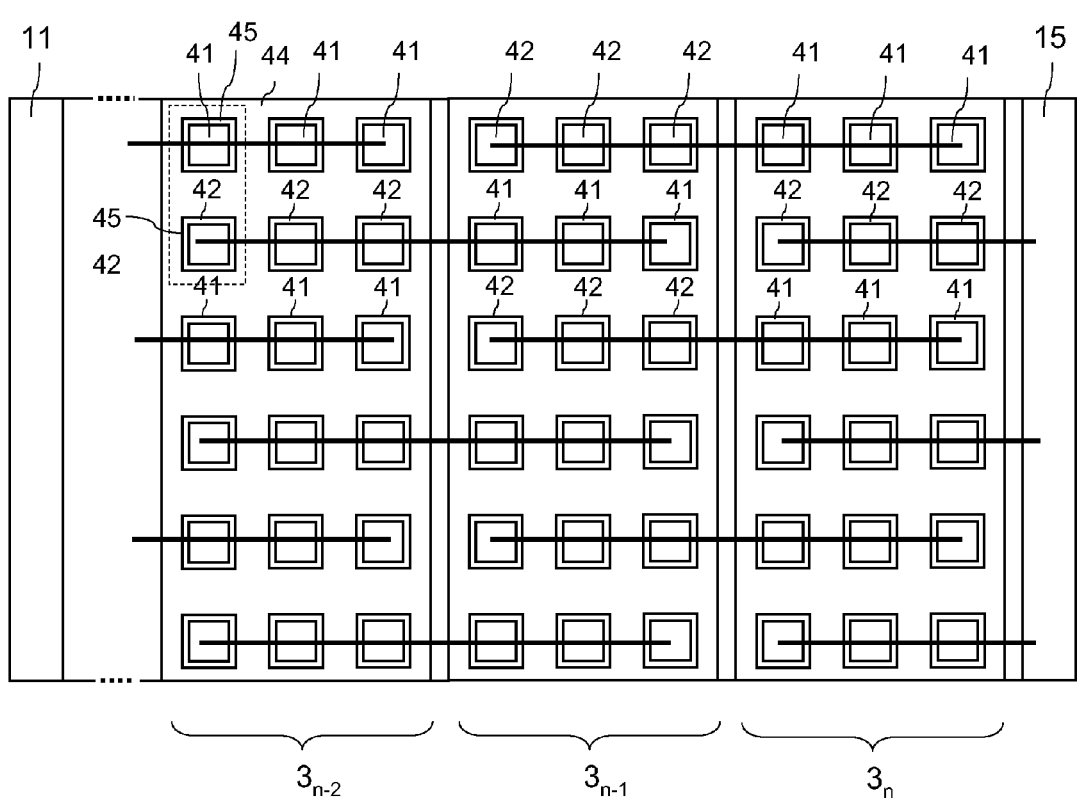
FIG. 11 illustrates a top view on a transistor arrangement according to a further embodiment in which the second transistors include several transistor cells connected in parallel.

FIG. 11 illustrates a top view on a further embodiment of a second transistor arrangement. In this embodiment source and drain regions 41, 42 of the transistor cells of one second transistor are arranged distant in a direction perpendicular to the current flow direction. In this direction perpendicular to the current flow direction source and drain regions of the individual transistor cells are arranged alternatingly, wherein the source regions 41 of one second transistor, like transistor $3_{n-2}$, are electrically connected with the drain regions 42 of a neighboring transistor, like transistor $3_{n-1}$. The individual transistor cells of one transistor have a common gate electrode 44. The gate electrode of one second transistor is electrically connected to the source region of a neighboring second transistor in a manner as explained in detail hereinbefore.

The active regions of the first transistor and the active regions of the second transistors can have conventional doping concentrations. In the first transistor 1, the doping concentration of the source and drain regions 11, 15 is, e.g., in the range of between $10^{19}$ cm$^{-3}$ and $10^{21}$ cm$^{-3}$, the doping concentration of the body region 12 is, e.g., in the range of between $10^{15}$ cm$^{-3}$ and $10^{19}$ cm$^{-3}$, and the doping concentration of the drift region 2 is, e.g., in the range of between $10^{13}$ cm$^{-3}$ and $10^{15}$ cm$^{-3}$. In the second transistors $3_1$-$3_n$, the doping concentration of the source and drain regions 41, 42 is, e.g., in the range of between $10^{19}$ cm$^{-3}$ and $10^{21}$ cm$^{-3}$, and the doping concentration of the body region 12 is, e.g., in the range of between $10^{17}$ cm$^{-3}$ and $10^{20}$ cm$^{-3}$.

Figure 12:
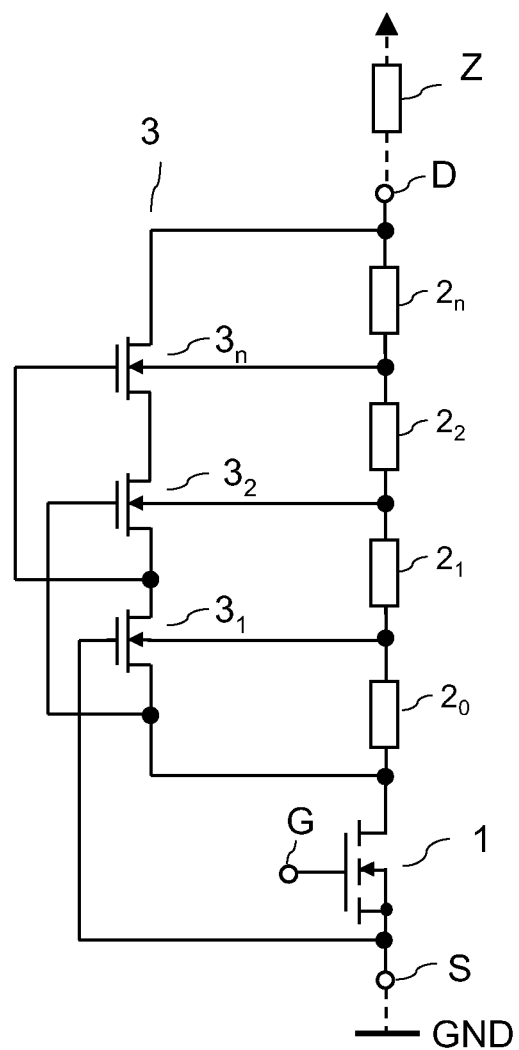
FIG. 12 illustrates a further embodiment of a transistor arrangement with a first transistor having a drift zone.

FIG. 12 illustrates a further embodiment of a transistor arrangement in which the second transistors $3_1$-$3_n$ are implemented as MOSFET, in particular as a depletion MOSFET. Unlike the arrangement illustrated in FIG. 1, the second transistors of the arrangement of FIG. 12 are coupled to the drift region of the first transistor 1 via their bulk/body terminals instead of their source terminals. However, the second transistors $3_1$-$3_n$ have their load paths connected in series, and the gate terminal of one second transistor is connected to the source terminal of a neighboring second transistor, wherein the second transistor $3_1$ that has its load path directly connected to the load path of the first transistor, has its gate terminal connected to the source terminal of the first transistor 1.

Figure 13:
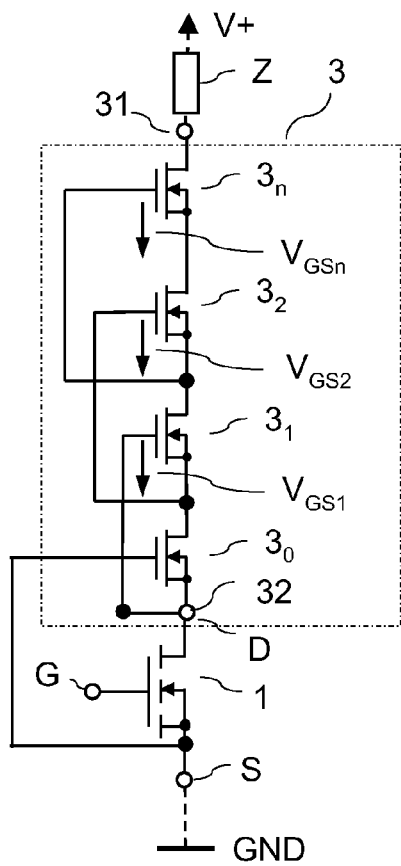
FIG. 13 illustrates another embodiment of a transistor arrangement with a first transistor and a plurality of second transistors.

FIG. 13 illustrates a further embodiment of a transistor arrangement. This transistor arrangement includes a first transistor 1 and an arrangement 3 with a plurality of second transistors $3_0$-$3_n$. The first transistor 1 has a load path between a first and a second load terminal and a control terminal, and each of the second transistors has a load path between a first and a second load terminal and a control terminal. The second transistors $3_0$-$3_n$ have their load paths connected in series between terminals 31, 32, wherein a series circuit with the load paths of the second transistors $3_0$-$3_n$ is connected in series with the load path of the first transistor 1. The first transistor 1 can be a power transistor with a drift zone (not illustrated) but could also be a low-voltage transistor without a drift region.

Each of the second transistors $3_0$-$3_n$ has its control terminal connected to the load terminal of another one of the second transistors $3_0$-$3_n$ or to one of the load terminals of the first transistor 1. In the embodiment illustrated in FIG. 12 a first one $3_0$ of the second transistors which is adjacent to the first transistor 1 so that it has its load path directly connected to the load path of the first transistor 1 has its control terminal connected to a first load terminal of the first transistor 1. The other second transistors, which are transistors $3_1$-$3_n$ in the embodiment illustrated in FIG. 13, have their control terminals connected to the first load terminal of the adjacent second transistor. The connection of the control terminals of the second transistors to the load terminals of the first transistor 1 or to the load terminals of another one of the second transistors is such that the first one $3_0$ of the second transistors has a drive voltage which corresponds to the voltage across the load path of the first transistor 1, and such that the drive voltages of the other second transistors correspond to the voltage across the load path of an adjacent second transistor.

In the embodiment illustrated in FIG. 13, the first transistor 1 and the second transistors $3_0$-$3_n$ are MOSFET which each have a gate terminal that forms a control terminal, and a drain and source terminal, wherein the drain and source terminals form load path terminals. The first one $3_0$ of the second transistors has its gate terminal connected to the source terminal of the first transistor, and the other second transistors $3_1$-$3_n$ has their gate terminals connected to the source terminal of an adjacent one of the second transistors. The first transistor 1 is an enhancement MOSFET, and the second transistors $3_0$-$3_n$ are depletion MOSFET in this embodiment.

The transistor arrangement of the first transistor 1 and a second transistor $3_0$-$3_n$ can be switched on and off like a conventional transistor by applying a suitable drive voltage to the first transistor 1. The operating principle will now be explained. Assume that the arrangement is first in its on-state, so that the first transistor 1 and the second transistors are conducting and the first transistor 1 is switched off. In this case, a voltage drop across the load path of the first transistor 1 increases, thereby switching off the first one $3_0$ of the second transistors. When this second transistor is switched off, the voltage drop across its load path increases so that a second one $3_1$ of the second transistors is switched off, which in turn switches a third one $3_2$ of the second transistors off, etc. This continues until all of the second transistors $3_0$-$3_n$ are switched off.

When the arrangement is in its off-state and the first transistor is switched on, a decreasing voltage drop across the load path of the first transistor 1 switches the first one $3_0$ of the second transistors on, which in turn switches the second one of the second transistors $3_1$ on, etc. This continues until all of the second transistors $3_0$-$3_n$ are switched on.

Figure 14A:
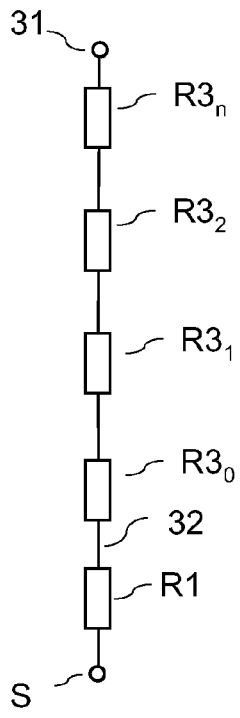
FIGS. 14A and 14B, show the equivalent circuit diagrams of the transistor arrangement of FIG. 13 when the first transistor is switched on (FIG. 14A) and when the first transistor is switched off (FIG. 14B)
Figure 14B:
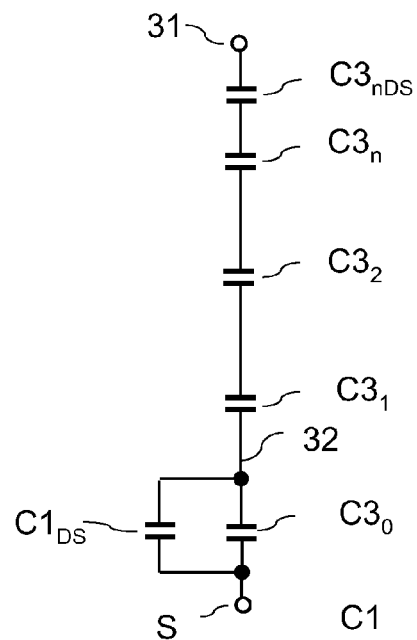

The voltage blocking capability of the overall transistor arrangement is, however, higher than the voltage blocking capability of only the first transistor 1. In its on-state, the transistor arrangement behaves like a series circuit of resistors, which is illustrated in FIG. 14A. The individual resistors R1 and R$3_0$-R$3_n$ each represent the one-resistances of the individual transistors connected in series. In the off-state as shown in FIG. 14B, the transistor arrangement behaves like a series circuit with capacitors C$3_0$-C$3_n$, wherein each of the capacitors represents the gate-source-capacitance of one of the transistors connected in series. The capacitor C$1_{DS}$ connected in parallel with the gate-source-capacitance C$3_0$ of the first one of the second transistors represents the drain-sourcecapacitance of the first transistor 1. The capacitor $C3_{nDS}$ connected between the gate-source-capacitance $C3_n$ of the second transistor $3_n$ represents the drain-source-capacitance of the second transistor $3_n$. The drain-source-capacitances of the other second transistors are not explicitly shown in FIG. 14B.

In the embodiment illustrated in FIG. 13, the first transistor 1 is a normally-off (enhancement) transistor, while the second transistor $3_0$-$3_n$ are normally-on (depletion) transistors. However, this is only an example. Each of the first transistor and the second transistors can be implemented as a normally-on transistor or as a normally-off transistor. Furthermore, the individual transistors can be implemented as n-type transistors or p-type transistors.

Figure 15:
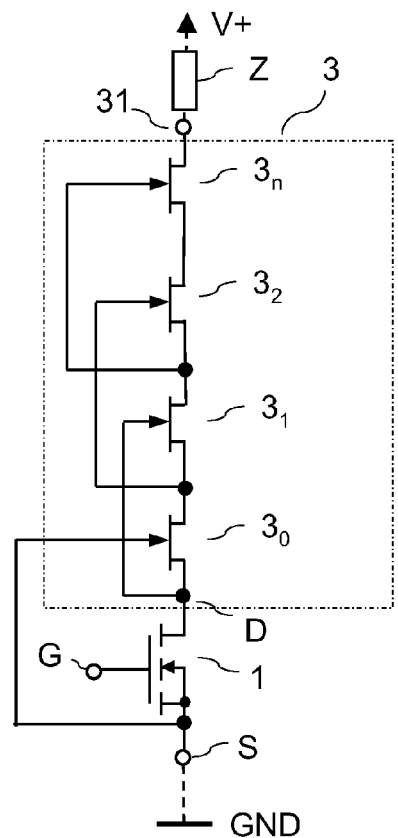
FIG. 15 illustrates an embodiment of the arrangement of FIG. 13 in which the second transistors are implemented as JFETs.
Figure 16:
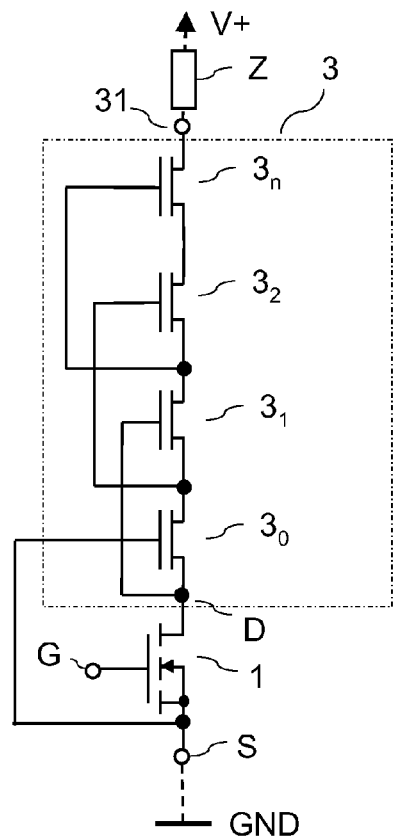
FIG. 16 illustrates an embodiment of the arrangement of FIG. 13 in which the second transistors are implemented as nanotube devices or HEMTS.

Further, any type of transistor can be used to implement the first transistor 1 and the second transistors $3_0$-$3_n$, like a MOSFET, a MISFET, a MESFET, an IGBT, a JFET, a FINFET, a nanotube device, or an HEMT, etc. FIG. 15 illustrates an embodiment in which the first transistor 1 is an (n-type) enhancement transistor while the second transistors are n-type JFET. In other words, the first transistor 1 and/or the second transistors $3_0$-$3_n$ can comprise n-channel transistors. Of course, the arrangement could also be implemented with p-type transistors (e.g., p-channel transistors) as the first transistor 1 and the second transistors $3_0$-$3_n$. FIG. 16 illustrates an embodiment in which the first transistor 1 is an (n-type) enhancement transistor while the second transistors are nanotube devices or HEMTs.

Further, the first transistor 1 and/or the second transistors $3_0$-$3_n$ can comprise a wide variety of materials including, but not limited to, one of the following materials or compositions thereof: Si, SiO, SiN, Ge, Ga, Al, GaAs, GaN, carbon, In, InP, or SiC.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A transistor arrangement, comprising:
   a first transistor with a drift region; and
   a plurality of second transistors, each second transistor having a source region, a drain region and a gate electrode,
   wherein the second transistors are coupled in series to form a series circuit that is coupled in parallel with the drift region of the first transistor, and
   wherein the source regions of the second transistors are coupled to the drift region and wherein the gate electrodes of the second transistors are coupled to the drift region, wherein the source region and the gate electrode of each of the second transistors are coupled to the drift region at different locations in a physical layout of the transistor arrangement, and wherein the drain region and gate electrode of each of the second transistors are coupled to different locations in the physical layout of the transistor arrangement.

2. The transistor arrangement of claim 1, wherein the drift region has a current flow direction and wherein the gate electrode and the source region of each of the second transistors are coupled to the drift region at different locations in the current flow directions.

3. The transistor arrangement of claim 2, wherein the source region and the drain region of the second transistors are arranged distant from each other in the current flow direction.

4. The transistor arrangement of claim 2, wherein the source region and the drain region of the second transistors are arranged distant from each other in a direction that is perpendicular to the current flow direction.

5. The transistor arrangement of claim 1, wherein the second transistors each comprise a plurality of transistor cells, wherein the plurality of transistor cells of one second transistor have a common gate electrode.

6. The transistor arrangement of claim 2, wherein the second transistors comprise depletion transistors.

7. The transistor arrangement of claim 2, wherein the second transistors comprise enhancement transistors.

8. The transistor arrangement of claim 2, wherein the first transistor further comprises:
   a source region;
   a body region adjoining the source region; and
   a drain region that is arranged between the body region and the drain region.

9. The transistor arrangement of claim 8,
   wherein the first transistor is an n-type transistor, and
   wherein the gate electrode of each of the second transistors is coupled to the drift region at a location that is closer to the body region than a location at which the source region is coupled to the drift region.

10. The transistor arrangement of claim 2,
    wherein each second transistor further includes a source terminal and a drain terminal, and
    wherein the source terminal and the drain terminal of one second transistor are arranged distant to each other in the current flow direction.

11. The transistor arrangement of claim 2,
    wherein each second transistor further includes a source terminal and a drain terminal, and
    wherein the source terminal and the drain terminal of one second transistor are arranged distant to each other in a direction perpendicular to the current flow direction.

12. A transistor arrangement, comprising:
    a first transistor having a load path and a control terminal; and
    a plurality of second transistors, each second transistor having a load path between a first and a second load terminal and a control terminal;
    wherein the second transistors have their load paths coupled in series and coupled in series to the load path of the first transistor;
    wherein each of the second transistors has its control terminal coupled to the load terminal of one of the other second transistors and not directly connected to its own first load terminal or second load terminal; and
    wherein one of the second transistors has its control terminal coupled to one of the load terminals of the first transistor.

13. The transistor arrangement of claim 12,
wherein a second transistor that has its load path directly connected to the load path of the first transistor and has its control terminal connected to a first load terminal of the first transistor; and
wherein each second transistor has its control terminal coupled to a first load terminal of an adjacent second transistor.

14. The transistor arrangement of claim 12, wherein the first transistor and/or the second transistor is one of a MOSFET, a MISFET, a MESFET, an IGBT, a JFET, a HEMT, a FINFET, or a nanotube device.

15. The transistor arrangement of claim 12, wherein the first transistor and/or the second transistors comprise one of the following materials or compositions thereof: Si, SiO, SiN, Ge, Ga, Al, GaAs, GaN, carbon, In, InP, or SiC.

16. The transistor arrangement of claim 12, wherein the first transistor is a normally-off transistor.

17. The transistor arrangement of claim 12, wherein the second transistors are normally-on transistors.

18. The transistor arrangement of claim 12, wherein the first transistor is one of an n-channel or p-channel transistor.

19. The transistor arrangement of claim 12, wherein the second transistors are one of n-channel or p-channel transistors.

20. A transistor arrangement, comprising:
a first transistor with a drift region; and
a plurality of second transistors, each second transistor having a source region, a drain region and a gate electrode,
wherein the second transistors are coupled in series to form a series circuit that is coupled in parallel with the drift region of the first transistor, and
wherein the source regions of the second transistors are coupled to the drift region and wherein the gate electrodes of the second transistors are coupled to the drift region, wherein the source region and the gate electrode of each of the second transistors are coupled to the drift region at different locations in a physical layout of the transistor arrangement, and wherein the second transistors each comprise a plurality of transistor cells, wherein the plurality of transistor cells of one second transistor have a common gate electrode.

* * * * *